US011605695B2

(12) United States Patent
Kim

(10) Patent No.: US 11,605,695 B2
(45) Date of Patent: Mar. 14, 2023

(54) DISPLAY DEVICE AND METHOD FOR MANUFACTURING THE SAME

(71) Applicant: Samsung Display Co., Ltd., Yongin-Si (KR)

(72) Inventor: Byoungyong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 379 days.

(21) Appl. No.: 17/004,250

(22) Filed: Aug. 27, 2020

(65) Prior Publication Data

US 2021/0066443 A1 Mar. 4, 2021

(30) Foreign Application Priority Data

Aug. 28, 2019 (KR) .................. 10-2019-0105935

(51) Int. Cl.
*H01L 27/32* (2006.01)
*H01L 51/52* (2006.01)
*H01L 51/56* (2006.01)
*G02F 1/1362* (2006.01)

(52) U.S. Cl.
CPC .... *H01L 27/3276* (2013.01); *G02F 1/136286* (2013.01); *H01L 51/529* (2013.01); *H01L 51/56* (2013.01)

(58) Field of Classification Search
CPC .......................... H01L 27/3276; H01L 51/529
See application file for complete search history.

(56) References Cited

U.S. PATENT DOCUMENTS

| 10,090,334 | B2 | 10/2018 | Bae et al. |
| 10,908,468 | B2* | 2/2021 | Yoo .................. B24B 9/065 |
| 2016/0121435 | A1 | 5/2016 | Furukawa et al. |
| 2016/0377905 | A1* | 12/2016 | Choi .................. H01L 24/32 257/72 |
| 2017/0358602 | A1* | 12/2017 | Bae .................. G02F 1/13458 |
| 2018/0061367 | A1* | 3/2018 | Ye .................. G09G 5/10 |
| 2019/0094633 | A1* | 3/2019 | Song .................. G02F 1/13452 |
| 2019/0103376 | A1 | 4/2019 | Han et al. |
| 2019/0243199 | A1* | 8/2019 | Bae .................. G02F 1/133345 |
| 2019/0384089 | A1* | 12/2019 | Jeon .................. G02F 1/1339 |

FOREIGN PATENT DOCUMENTS

| KR | 1020150129975 A | 11/2015 |
| KR | 101767396 B1 | 8/2017 |
| KR | 101780139 B1 | 10/2017 |
| KR | 1020170139211 A | 12/2017 |

* cited by examiner

*Primary Examiner* — Douglas M Menz
(74) *Attorney, Agent, or Firm* — Cantor Colburn LLP

(57) ABSTRACT

A display device includes a display panel including a display substrate and a connection pad disposed on a side surface of the display substrate, and a circuit board including a base board, and a driving pad disposed on the base board to face the connection pad and being in electrical contact with the connection pad. The connection pad includes a top surface, at least a portion of which is recessed to define a recessed space and facing the base board, and a bottom surface facing the side surface of the display substrate. The driving pad is disposed in the recessed space.

20 Claims, 13 Drawing Sheets

DISPLAY DEVICE AND METHOD FOR MANUFACTURING THE SAME

This U application claims priority to Korean Patent Application No. 10-2019-0105935, filed on Aug. 28, 2019, and all the benefits accruing therefrom under 35 U.S.C. § 119, the content of which in its entirety is herein incorporated by reference.

BACKGROUND

1. Field

The disclosure herein relates to a display device, and more particularly, to a display device and a method for manufacturing the same.

2. Description of the Related Art

Various display devices used in multimedia devices such as televisions, portable phones, tablet computers, navigation systems, and game consoles have been developed.

A display device may include a display panel for displaying an image. The display panel may include a plurality of gate lines, a plurality of data lines, and a plurality of pixels connected to the plurality of gate lines and the plurality of data lines. The display device may include a circuit board that provides electrical signals used for displaying an image to the gate lines or the data lines.

SUMMARY

In a display device, a circuit board may be electrically connected to a display panel by a bonding method of connecting two pads through an anisotropic conductive film or a bonding method of directly connecting two pads to each other.

Embodiments of the disclosure are directed to a display device in which a pad of a circuit board is connected directly to a pad of a display panel on a side surface of the display panel, and a method for manufacturing the display device.

In an embodiment of the invention, a display device includes a display panel including a display substrate and a connection pad disposed on a side surface of the display substrate, and a circuit board including a base board, and a driving pad disposed on the base board to face the connection pad and being in electrical contact with the connection pad. In such an embodiment, the connection pad includes a top surface, at least a portion of which is recessed to define a recessed space and facing the base board, and a bottom surface facing the side surface of the display substrate. In such an embodiment, the driving pad is disposed in the recessed space.

In an embodiment, an entire portion of the driving pad may overlap the connection pad, and a planar area of the connection pad may be greater than a planar area of the driving pad.

In an embodiment, one portion of the connection pad not overlapping the driving pad may have a thickness greater than a thickness of another portion of the connection pad overlapping the driving pad.

In an embodiment, the thickness of the one portion of the connection pad may be two or more times greater than the thickness of the another portion of the connection pad.

In an embodiment, the driving pad may include a first metal layer disposed on the base board, and a second metal layer covering the first metal layer and disposed on the base board.

In an embodiment, a thickness of the first metal layer may be greater than a thickness of the second metal layer, and the first metal layer and the second metal layer may include different materials from each other.

In an embodiment, the first metal layer may include copper, and the second metal layer may include tin.

In an embodiment, the connection pad may include a material different from materials of the first metal layer and the second metal layer.

In an embodiment, the display device may further include a filler covering the driving pad and the connection pad, which are in contact with each other, and the filler may be disposed between the base board and the side surface of the display panel.

In an embodiment, the display substrate may include a first display substrate including a first side surface, and a second display substrate facing the first display substrate and including a second side surface aligned with the first side surface. The side surface of the display panel may be defined by the first side surface and the second side surface.

In an embodiment of the invention, a display device includes a display panel including a display substrate and a connection pad disposed on a side surface of the display substrate, and a circuit board including a base board, and a driving pad disposed on the base board to face the connection pad and being in electrical contact with the connection pad. In such an embodiment, an entire portion of the connection pad overlaps the driving pad in a plan view of the circuit board, and the driving pad surrounds the connection pad in the plan view of the circuit board.

In an embodiment, the driving pad may include a first metal layer disposed on the base board, and a second metal layer covering the first metal layer and disposed on the base board. In such an embodiment, the connection pad may include a material different from materials of the first metal layer and the second metal layer.

In an embodiment of the invention, a method for manufacturing a display device includes preparing a display substrate, forming a conductive layer by providing a conductive material onto one side surface of the display substrate, forming a plurality of connection pads spaced apart from each other by radiating first laser to the conductive layer, performing an aligning process in a way such that driving pads of a circuit board face the connection pads, respectively, disposing the driving pads to contact the connection pads, respectively, pressing the circuit board in a way such that portions of the connection pads are recessed by the driving pads, respectively, and radiating second laser to the connection pads to harden the connection pads.

In an embodiment, the method may further include applying a heat based on a first temperature to the conductive layer after the forming the conductive layer. In such an embodiment, the conductive layer may have a first hardness by the first temperature.

In an embodiment, the second laser may provide heat of a second temperature higher than the first temperature to the connection pads, and the connection pads may have a second hardness higher than the first hardness by the second laser.

In an embodiment, an intensity of the first laser may be greater than an intensity of the second laser.

In an embodiment, the first temperature may be a room temperature.

In an embodiment, an entire portion of a first driving pad of the driving pads may overlap a first connection pad of the connection pads, which corresponds to the first driving pad, in a plan view of the circuit board. In such an embodiment, the first connection pad may surround the first driving pad in the plan view of the circuit board.

In an embodiment, the pressing the circuit board and the radiating the second laser to the connection pads may be performed simultaneously with each other.

In an embodiment, the method may further include providing a filler between the one side surface of the display substrate and the circuit board. The filler may fully cover the driving pads and the connection pads.

BRIEF DESCRIPTION OF THE DRAWINGS

The above and other features of embodiments of the invention will become readily apparent by reference to the following detailed description of exemplary embodiments when considered in conjunction with the accompanying drawings, in which.

DETAILED DESCRIPTION

Figure 1A:
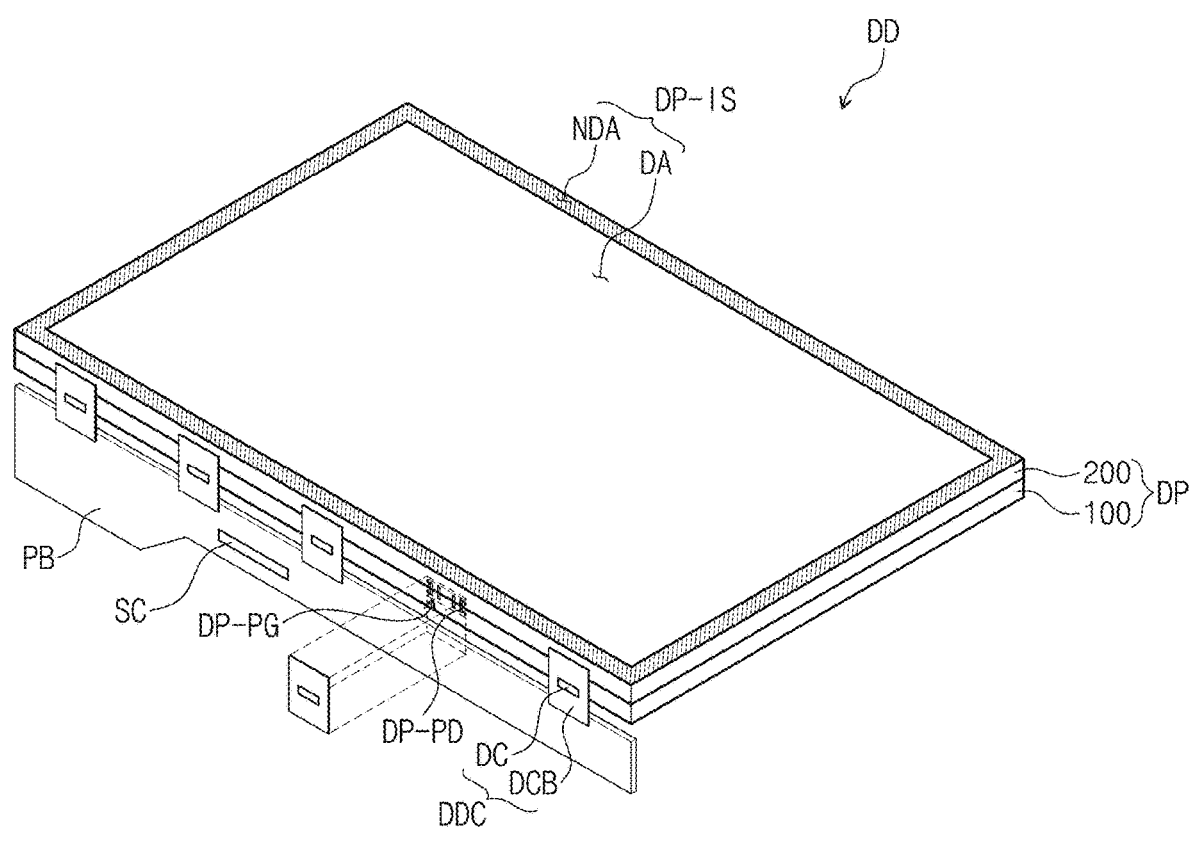
FIG. 1A is a perspective view illustrating a display device according to an embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being "on," "connected to" or "coupled to" another element, it can be directly on the other element or intervening elements may be present. In contrast, when an element is referred to as being "directly on", "connected directly to" or "coupled directly to" another element or layer, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, embodiments of the invention will be described in detail with reference to the accompanying drawings.

Figure 1B:
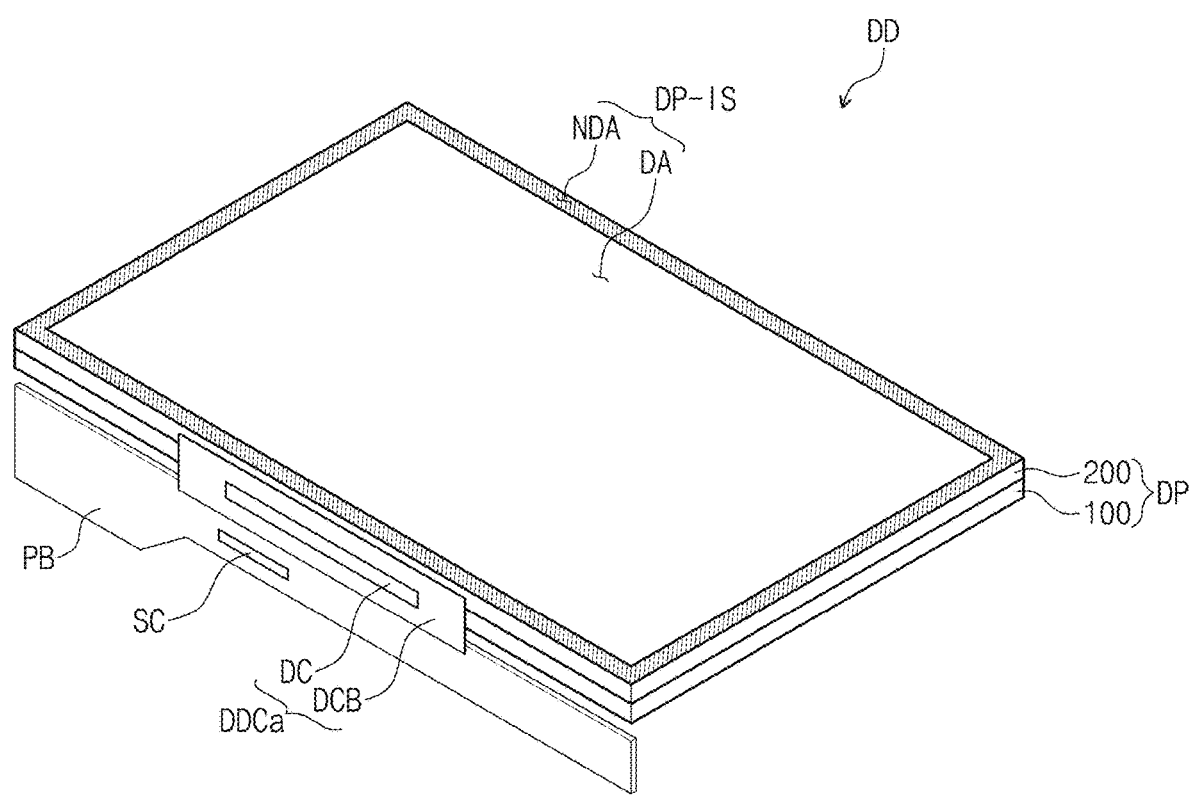
FIG. 1B is a perspective view illustrating a display device according to an alternative embodiment of the invention.

FIG. 1A is a perspective view illustrating a display device according to an embodiment of the invention. FIG. 1B is a perspective view illustrating a display device according to an alternative embodiment of the invention.

Referring to FIG. 1A, an embodiments of a display device DD may include a display panel DP, a connection circuit board DDC, a main circuit board PB, and a signal controller SC.

The display device DD may display an image through a display surface DP-IS. In an embodiment, as shown in FIG. 1A, the display device DD may include a flat display surface DP-IS. However, embodiments of the invention are not limited thereto. In an alternative embodiment, the display device DD may include a curved display surface or a three-dimensional ("3D") display surface. The 3D display surface may include a plurality of display areas extending in different directions from each other. In one embodiment, for example, the 3D display surface may include a polygonal pillar-shaped display surface.

In an embodiment, the display device DD may be a flexible display device. However, embodiments of the invention are not limited thereto. In an alternative embodiment, the display device DD may be a rigid display device.

In an embodiment, even though not shown in the drawings, electronic modules, a camera module and a power module, which are mounted on a main board, may be disposed together with the display device DD in a bracket and/or a case to constitute an electronic device, e.g., a mobile phone. Such an embodiment of the display device DD may be applied to large-sized electronic devices (e.g., televisions and monitors) and small and middle-sized electronic devices (e.g., tablets, car navigation units, game consoles, and smart watches).

The display surface DP-IS may be parallel to a plane defined by a first direction DR1 and a second direction DR2. A normal direction of the display surface DP-IS (i.e., a thickness direction of the display device DD) may be indicated by a third direction DR3. Herein, it may be understood that when one or more components are viewed in a plan view, the one or more components may be viewed in a direction opposite to the third direction DR3. In addition, a planar area or size may mean an area or size when viewed in the direction opposite to the third direction DR3. A front surface (or a top surface) and a rear surface (or a bottom surface) of each of members or units described hereinafter may be defined based on the third direction DR3. However, the first to third directions DR1, DR2 and DR3 shown in the drawings are merely exemplary, and directions indicated by the first to third directions DR1, DR2 and DR3 may be changed into opposite directions.

In an embodiment, the display panel DP may generate an image and may provide the generated image to a window (not shown). According to an embodiment of the invention, the display panel DP may be, but not limited to, an organic light emitting display panel, a liquid crystal display panel, or a quantum-dot light emitting display panel. The organic light emitting display panel may include organic light emitting elements. The liquid crystal display panel may include liquid crystal molecules. The quantum-dot light emitting display panel may include quantum dots or quantum rods.

Hereinafter, for convenience of description, embodiments in which the display panel DP is the organic light emitting display panel will be described in detail. However, embodiments of the invention are not limited thereto. In other alternative embodiments, the display panel DP may be one of other various types of display panel.

In an embodiment, the display panel DP may include a first display substrate 100 and a second display substrate 200 disposed on the first display substrate 100. The display panel DP may include a display area DA and a non-display area NDA adjacent to the display area DA. According to an embodiment, as illustrated in FIG. 1A, the display area DA may have a rectangular shape, and the non-display area NDA may have a shape surrounding the display area DA in a plan view. However, embodiments of the invention are not limited thereto. The shapes of the display area DA and the non-display area NDA may be variously designed or modified. In one embodiment, for example, the non-display area NDA may be disposed adjacent to only one side of the display area DA or may be omitted.

The display panel DP may include a bottom surface and a top surface opposite to each other in the third direction DR3, and side surfaces connecting the bottom surface and the top surface. The bottom surface of the display panel DP may correspond to a bottom surface of the first display substrate 100, and the top surface of the display panel DP may correspond to a top surface of the second display substrate 200.

According to an embodiment of the invention, a connection pad group DP-PG may be disposed on one of the side surfaces of the display panel DP. The connection pad group DP-PG may be electrically connected to pixels (see FIG. 2B) included in the display panel DP. The connection pad group DP-PG may be provided in plural, and the plurality of connection pad groups DP-PG may be arranged in the first direction DR1. Each of the connection pad groups DP-PG may include a plurality of connection pads DP-PD (see FIG. 3).

The connection circuit board DDC may face the one side surface of the display panel DP. The connection circuit board DDC may include a base board DCB facing the one side surface of the display panel DP, and a driving chip DC disposed on the base board DCB. The base board DCB may be a flexible printed circuit board having a flexible property.

The connection circuit board DDC may be provided in plural, and the plurality of connection circuit boards DDC may be arranged in the first direction DR1. The plurality of connection circuit boards DDC may be electrically connected to the plurality of connection pad groups DP-PG, respectively. Hereinafter, for convenience of description, one connection circuit board DDC and one connection pad group DP-PG electrically connected thereto will be mainly described in detail.

According to an embodiment of the invention, the connection circuit board DDC may further include driving pads CB-PD (see FIG. 3) that are in contact with the connection pads DP-PD of the connection pad group DP-PG, respectively. The connection pads DP-PD and the driving pads CB-PD may be electrically connected to each other not through an additional conductive film but may be connected directly to each other. This will be described later in greater detail with reference to FIG. 3.

The driving chip DC may be disposed on the base board DCB. The driving chip DC may output a plurality of image signals corresponding to images outputted from the display panel DP. The driving chip DC may transmit the image signals to the display panel DP through the base board DCB and the connection pad group DP-PG. In an embodiment, as shown in FIG. 1A, the driving chip DC is disposed on the base board DCB. However, in an alternative embodiment, the driving chip DC may be disposed on the first display substrate 100, not the side surface of the display panel DP.

The main circuit board PB may be electrically connected to an end of the connection circuit board DDC. In one embodiment, for example, the main circuit board PB may be a printed circuit board having a rigid property. The signal controller SC may be electrically connected to the connection circuit board DDC and may transmit a plurality of control signals to the display panel DP through the connection circuit board DDC. The control signals may include the image signals outputted from the driving chip DC and overall driving signals used for driving the display panel DP.

Referring to FIG. 1B, in an alternative embodiment, a display device DD may include a single connection circuit board DDCa. In such an embodiment, the display panel DP and the main circuit board PB may be electrically connected to each other through the single connection circuit board DDCa. According to an embodiment of the invention, the connection circuit board DDCa may be connected directly to the side surface of the display panel DP without an additional conductive film.

Figure 2A:
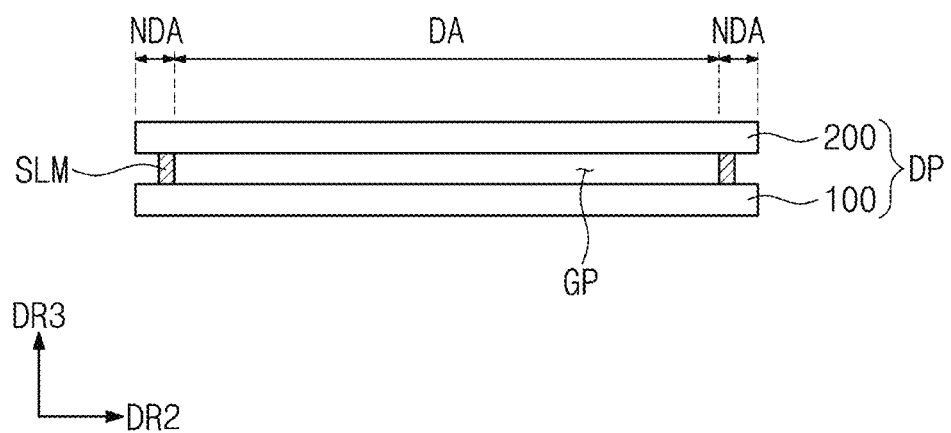
FIG. 2A is a cross-sectional view illustrating a display panel according to an embodiment of the invention.
Figure 2B:
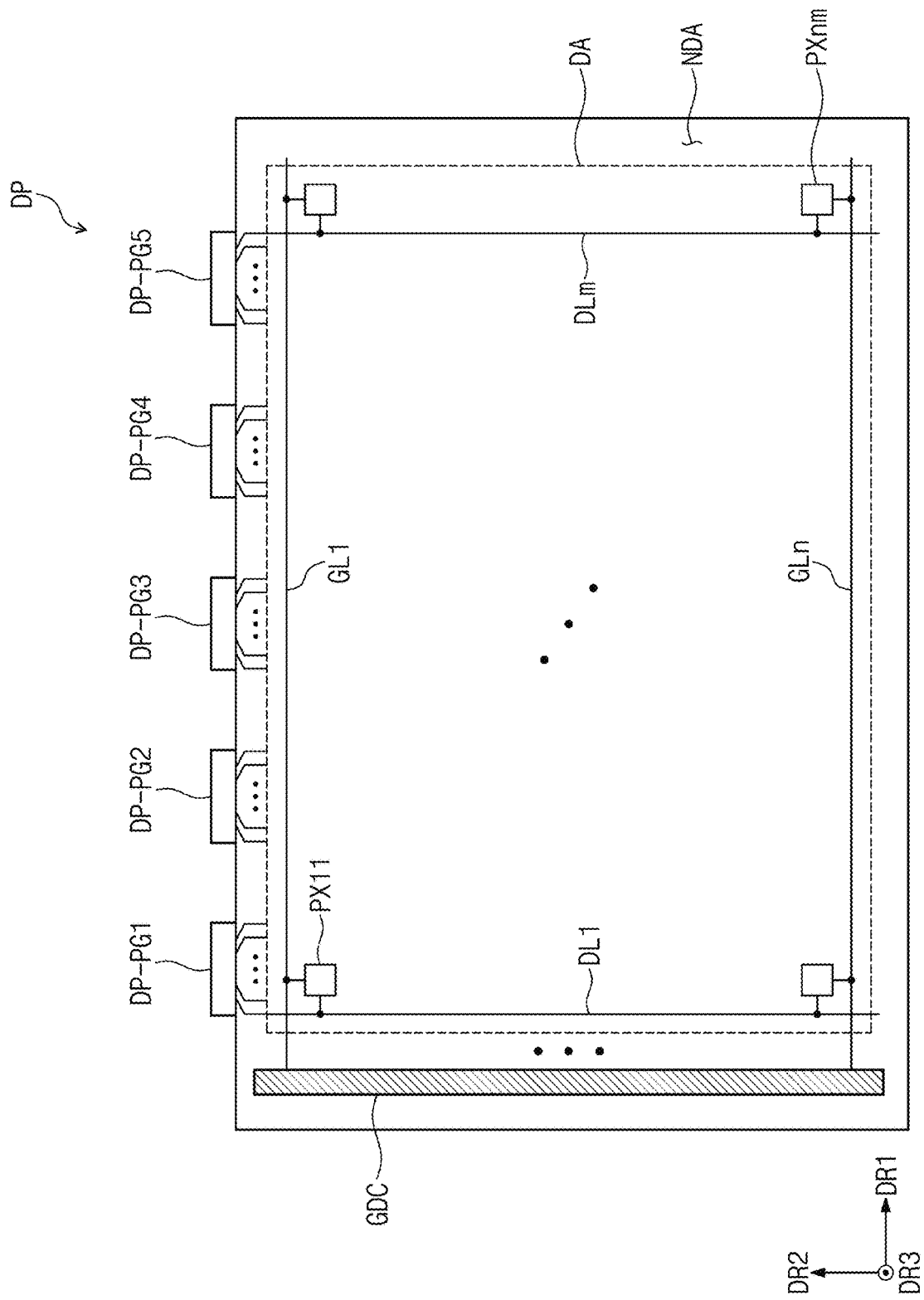
FIG. 2B is a plan view illustrating a display panel according to an embodiment of the invention.
Figure 3:
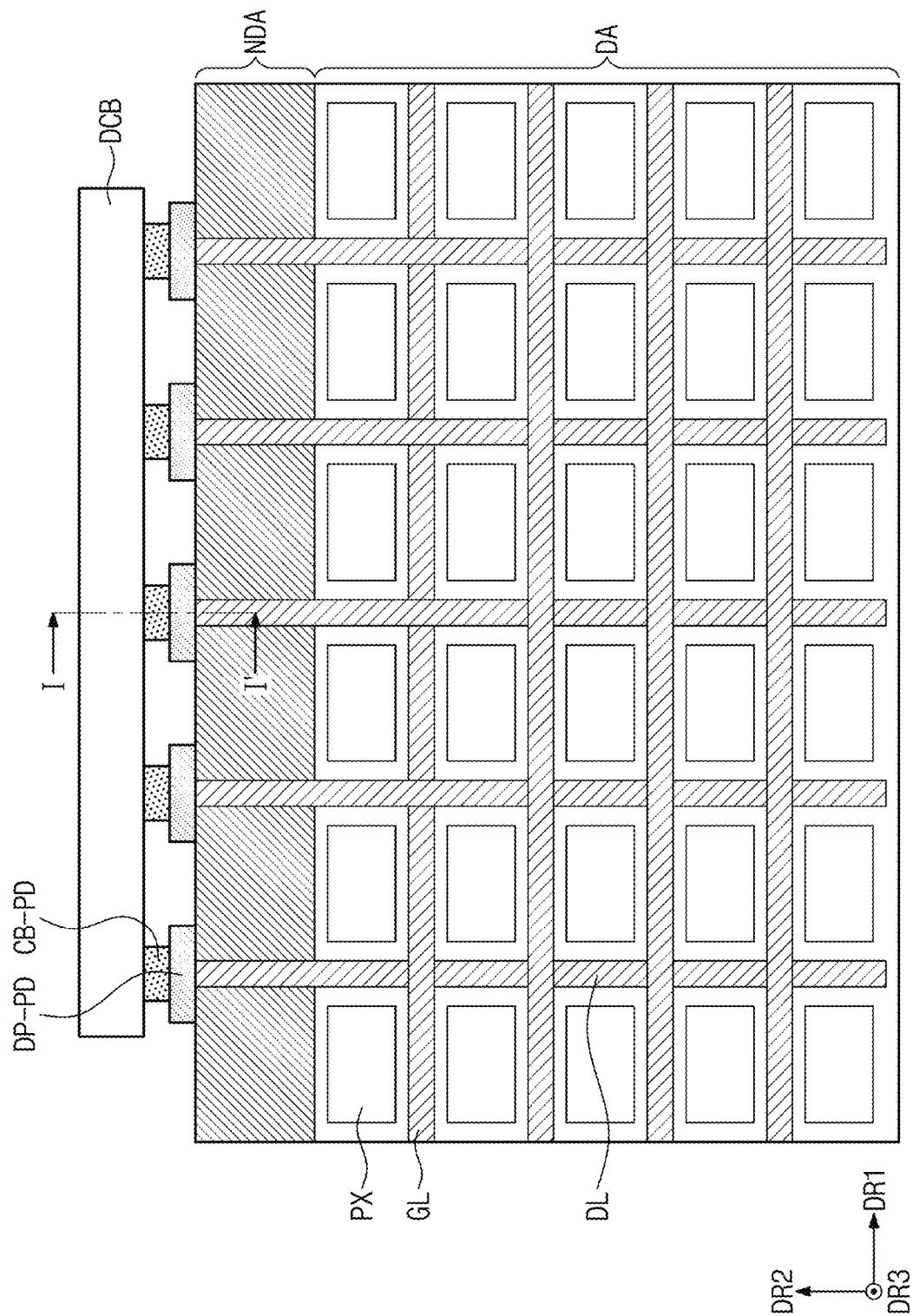
FIG. 3 is a plan view illustrating a portion of a display panel according to an embodiment of the invention.
Figure 4:
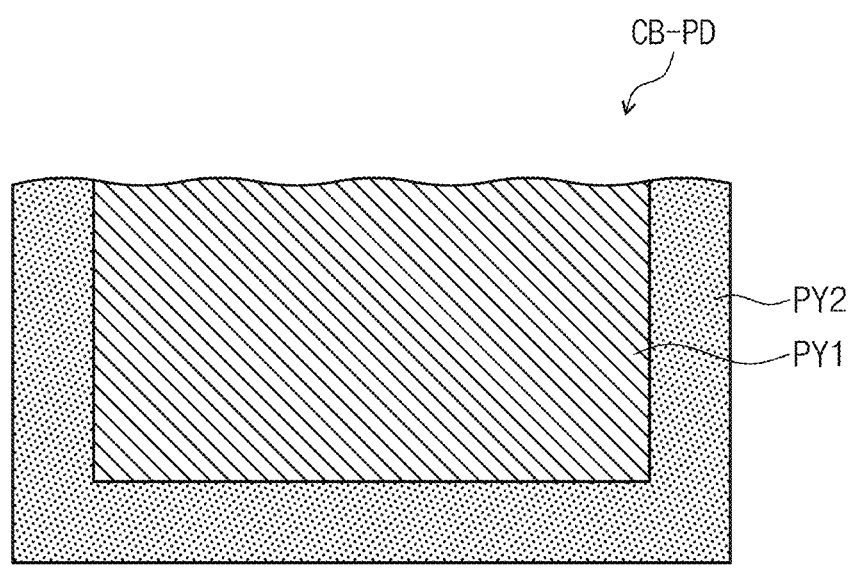
FIG. 4 is a cross-sectional view illustrating a driving pad of a circuit board of FIG. 3 according to an embodiment of the invention.

FIG. 2A is a cross-sectional view illustrating a display panel according to an embodiment of the invention. FIG. 2B is a plan view illustrating a display panel according to an embodiment of the invention. FIG. 3 is a plan view illustrating a portion of a display panel according to an embodiment of the invention. FIG. 4 is a cross-sectional view illustrating a driving pad of a circuit board of FIG. 3 according to an embodiment of the invention.

Referring to FIG. 2A, in an embodiment, each of the first and second display substrates 100 and 200 may include a plurality of layers. In one embodiment, for example, even though not shown in the drawings, the first display substrate 100 may include a base layer, a circuit element layer including signal lines and driving circuits which are disposed on the base layer, and a display element layer including display elements.

An inner space GP may be defined or formed between the first display substrate 100 and the second display substrate 200. The inner space GP may be maintained by an adhesive layer SLM disposed between the first and second display substrates 100 and 200. The adhesive layer SLM may overlap the non-display area NDA. In one embodiment, for example, the adhesive layer SLM may be an organic adhesive layer or an inorganic adhesive layer. The inner space GP may be sealed by the adhesive layer SLM, the first display substrate 100, and the second display substrate 200, and thus the circuit element layer and the display element layer included in the first display substrate 100 may be protected from external moisture, external oxygen, and/or a foreign material such as dust particles.

In an embodiment, even though not shown in the drawings, the second display substrate 200 may include an encapsulation layer connected to the adhesive layer SLM, and an input sensing layer disposed on the encapsulation layer. The input sensing layer may sense an input provided from the outside. The input provided from the outside may be provided in various forms. In one embodiment, for example, the external input may include at least one of various external inputs such as a touch by a part (e.g., a finger) of a user's body, a stylus pen, light, heat, and pressure. In an embodiment, the external input may include an approaching spatial touch (e.g., a hovering touch) as well as the touch of the part of the user's body. In an alternative embodiment, the input sensing layer may be omitted.

Referring to FIG. 2B, in an embodiment, the display panel DP may include a gate driving circuit GDC, pixels PX11 to PXnm, signal lines GL1 to GLn and DL1 to DLm, and connection pad groups DP-PG1 to DP-PG5. FIG. 2B illustrates planar arrangement of the signal lines GL1 to GLn and DL1 to DLm and the pixels PX11 to PXnm. The gate driving circuit GDC, pixel driving circuits of the pixels PX11 to PXnm and the signal lines GL1 to GLn and DL1 to DLm may be included in the circuit element layer of the first display substrate 100 described above.

The pixels PX11 to PXnm and portions of the signal lines GL1 to GLn and DL1 to DLm may overlap the display area DA in a plan view, and other portions of the signal lines GL1 to GLn and DL1 to DLm and the gate driving circuit GDC may overlap the non-display area NDA in a plan view. The signal lines GL1 to GLn and DL1 to DLm may include a plurality of gate lines GL1 to GLn and a plurality of data lines DL1 to DLm. Even though not shown in the drawings, the signal lines may further include power lines.

Each of the pixels PX11 to PXnm may be connected to a corresponding one of the plurality of gate lines GL1 to GLn and a corresponding one of the plurality of data lines DL1 to DLm. Each of the pixels PX11 to PXnm may include the pixel driving circuit and a display element. Other types of signal lines may be further provided in the display panel DP in accordance with configuration of the pixel driving circuit.

The pixels PX11 to PXnm may be arranged in a matrix form. However, embodiments of the invention are not limited thereto. In an alternative embodiment, the pixels PX11 to PXnm may be arranged in a pentile form. In still an alternative embodiment, the pixels PX11 to PXnm may be arranged in a diamond form.

The gate driving circuit GDC may be disposed in the non-display area NDA. In an embodiment, the gate driving circuit GDC may be integrated in the display panel DP by an oxide silicon gate driving circuit ("OSG") process or an amorphous silicon gate driving circuit ("ASG") process.

In a conventional display device, connection pad groups may entirely overlap a top surface of a first display substrate and may be disposed on a base layer of the first display substrate. Thus, an area (or size) of a non-display area may be determined in consideration of planar areas (or sizes) of the connection pad groups.

However, according to embodiments of the invention, the connection pad groups DP-PG1 to DP-PG5 may be disposed or formed on one side surface of the display panel DP. Since the connection pad groups DP-PG1 to DP-PG5 are disposed on the one side surface of the display panel DP, an area (or size) of the non-display area NDA of the display panel DP may be reduced by planar areas (or sizes) of the connection pad groups DP-PG1 to DP-PG5.

The connection pad groups DP-PG1 to DP-PG5 may be disposed on the one side surface of the display panel DP to be connected to data line groups, respectively. Here, each of the data line groups may include corresponding ones of the data lines DL1 to DLm. In one embodiment, for example, connection pads of a first connection pad group DP-PG1 may be in electrical contact with the data lines of a corresponding first data line group of the data line groups, respectively.

FIG. 3 illustrates an embodiment of connection pads DP-PD included in one of the connection pad groups DP-PG1 to DP-PG5 illustrated in FIG. 2B. FIG. 3 illustrates an embodiment of the driving pads CB-PD included in one of the connection circuit boards DDC. In one embodiment, for example, the connection pads DP-PD may include silver (Ag) or carbon (C).

In an embodiment, as illustrated in FIG. 3, an end of the data line DL may be connected directly to the connection pad DP-PD. Herein, it is understood that when components 'A' and 'B' are connected directly to each other, the components 'A' and 'B' are in contact with each other without an intervening component therebetween. In such an embodiment, the driving pad CB-PD disposed on the base board DCB may be connected directly to the connection pad DP-PD.

According to embodiments of the invention, the driving pad CB-PD of the connection circuit board DDC and the connection pad DP-PD of the display panel DP may be electrically connected to each other not through an additional conductive film but may be connected directly to each other. As a result, in such embodiment, an electrical short may be effectively prevented from occurring between adjacent two of the driving pads CB-PD of the connection circuit board DDC and/or between adjacent two of the connection pads DP-PD of the display panel DP.

Referring to FIG. 4, the driving pad CB-PD may include a first metal layer PY1 and a second metal layer PY2. The first metal layer PY1 may be disposed on the base board DCB of the connection circuit board DDC. The second metal layer PY2 may fully cover the first metal layer PY1 and may be disposed on the base board DCB. A thickness of the first metal layer PY1 may be greater than a thickness of the second metal layer PY2. In one embodiment, for example, the second metal layer PY2 may be a cover layer covering a surface of the first metal layer PY1. In such an embodiment, the connection pad DP-PD of the display panel DP may be connected directly to the second metal layer PY2.

According to an embodiment of the invention, the first metal layer PY1, the second metal layer PY2 and the connection pad DP-PD may include different materials from each other. In one embodiment, for example, the connection pad DP-PD may include silver (Ag), as described above. In one embodiment, for example, the first metal layer PY1 may include copper (Cu), and the second metal layer PY2 may include tin (Sn). In such an embodiment, the second metal layer PY2 including tin (Sn) fully covers the first metal layer PY1 including copper (Cu), such that oxidation reaction of the first metal layer PY1 with the outside may be inhibited or prevented. However, the materials of the first and second metal layers PY1 and PY2 are not limited thereto. In alternative embodiments, each of the first and second metal layers PY1 and PY2 may include one of other metal materials.

Figure 5A:
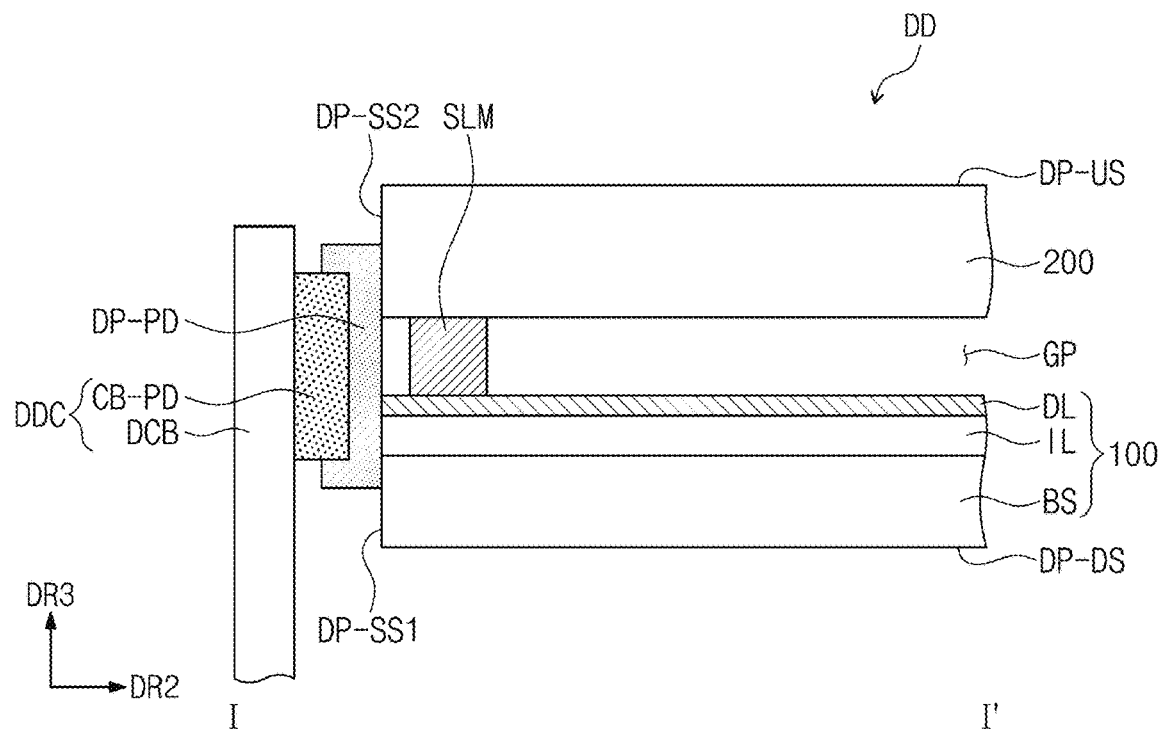
FIG. 5A is a cross-sectional view taken along line I-I' of FIG. 3 to illustrate a display device according to an embodiment of the invention.
Figure 5B:
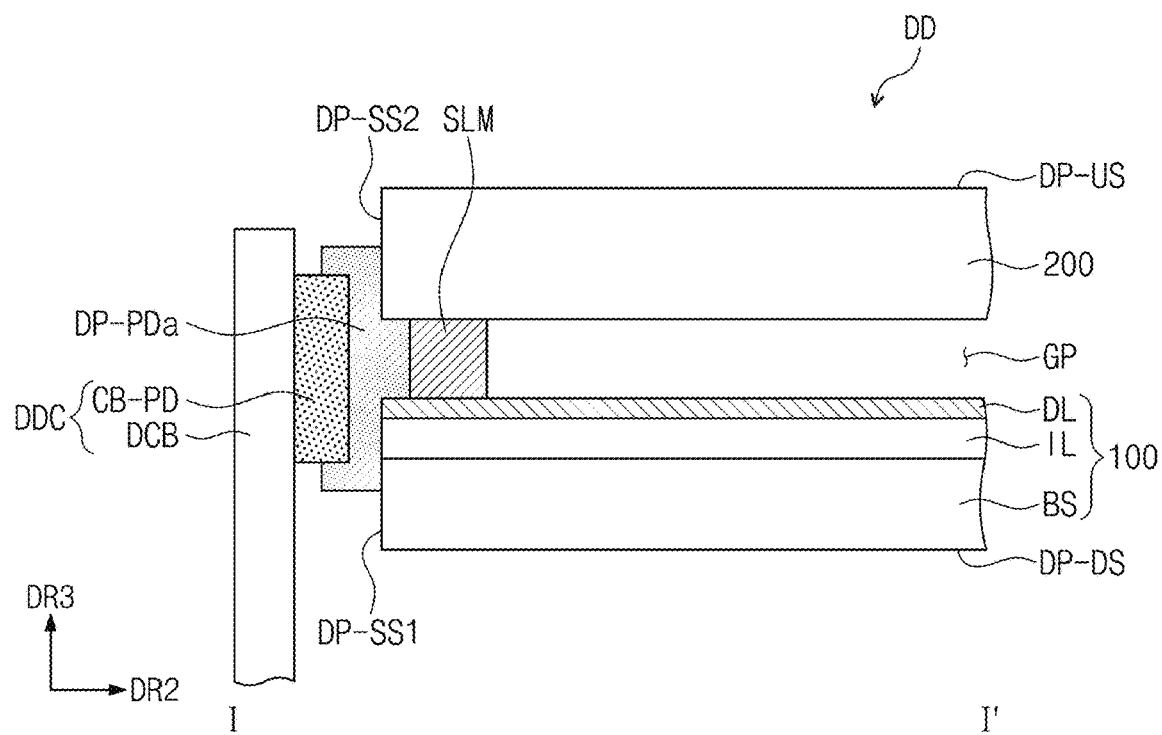
FIG. 5B is a cross-sectional view taken along line I-I' of FIG. 3 to illustrate a display device according to an alternative embodiment of the invention.

FIG. 5A is a cross-sectional view taken along line I-I' of FIG. 3 to illustrate a display device according to an embodiment of the invention. FIG. 5B is a cross-sectional view taken along line I-I' of FIG. 3 to illustrate a display device according to an alternative embodiment of the invention.

Referring to FIG. 5A, in an embodiment, the first display substrate 100 may include a base layer BS, an insulating layer IL, and the data line DL. The base layer BS may include a synthetic resin substrate or a glass substrate. The insulating layer IL and the data line DL may be disposed on the base layer BS and may be included in the circuit element layer of the first display substrate 100 described with reference to FIG. 2A. In the embodiment of FIG. 5A, the first display substrate 100 includes a single insulating layer IL. However, embodiments of the invention are not limited thereto. In an alternative embodiment, the first display substrate 100 may include a plurality of insulating layers.

The first display substrate 100 may include a bottom surface DP-DS and a first side surface DP-SS1. The bottom surface DP-DS of the first display substrate 100 may correspond to a bottom surface of the base layer BS or a bottom surface of the display panel DP. The second display substrate 200 may include a top surface DP-US and a second side surface DP-SS2. The top surface DP-US of the second display substrate 200 may correspond to a top surface of the display panel DP. A top surface of the first display substrate 100 may face the second display substrate 200, and a bottom surface of the second display substrate 200 may face the first display substrate 100.

The first side surface DP-SS1 of the first display substrate 100 may be aligned with the second side surface DP-SS2 of the second display substrate 200 in the third direction DR3. The one side surface of the display panel DP, which faces the connection circuit board DDC, may be defined by the first and second side surfaces DP-SS1 and DP-SS2.

The connection pad DP-PD may be disposed on the first and second side surfaces DP-SS1 and DP-SS2 aligned with each other. The connection pad DP-PD may have a single unitary body shape and may be disposed on the first and second side surfaces DP-SS1 and DP-SS2. According to an embodiment, as illustrated in FIG. 5A, the connection pad DP-PD may not overlap the top surface DP-US of the display panel DP.

However, embodiments of the invention are not limited thereto. In an alternative embodiment, at least a portion of the connection pad DP-PD may overlap the top surface DP-US of the display panel DP. According to an embodiment, as illustrated in FIG. 5B, a portion of a connection pad DP-PDa may be disposed between the first display substrate 100 and the second display substrate 200. In such an embodiment, the portion of the connection pad DP-PDa between the first display substrate 100 and the second display substrate 200 may be connected to the adhesive layer SLM.

Referring back to FIG. 5A, in an embodiment, the driving pad CB-PD of the connection circuit board DDC may be connected directly to the connection pad DP-PD of the display panel DP. Each of the driving pad CB-PD and the connection pad DP-PD may include a metal material, and the driving pad CB-PD and the connection pad DP-PD may be electrically connected to each other. Driving signals outputted from the driving chip DC disposed on the base board DCB may be transmitted to the data line DL through the driving pad CB-PD and the connection pad DP-PD.

According to an embodiment of the invention, an entire portion of the driving pad CB-PD may overlap the connection pad DP-PD when viewed in the second direction DR2, and a planar area (or size) of the connection pad DP-PD may be greater than a planar area (or size) of the driving pad CB-PD when viewed in the second direction DR2. In an embodiment, at least a portion of the driving pad CB-PD may be inserted in the connection pad DP-PD.

In an embodiment, the connection pad DP-PD may have a first hardness in a process of bonding the driving pad CB-PD and the connection pad DP-PD to each other. In such an embodiment, the connection pad DP-PD may be hardened to have the first hardness based on external heat having a first temperature, and the first temperature may be, for example, a room temperature. The room temperature may be a temperature in a range of about 15 degrees Celsius to about 25 degrees Celsius or in a range of about 21 degrees Celsius to about 23 degrees Celsius. In such an embodiment, the connection pad DP-PD having the first hardness may have a flexible state in which a shape is deformable by an external pressure.

In a process of bonding the driving pad CB-PD and the connection pad DP-PD to each other, the driving pad CB-PD may press an upper portion of the connection pad DP-PD having the first hardness by an external pressure. As a result, at least a portion of the driving pad CB-PD may be inserted in the connection pad DP-PD. Thereafter, the connection pad DP-PD may be hardened by external heat having a second temperature higher than the first temperature, and thus the connection pad DP-PD may have a second hardness higher than the first hardness. Herein, the connection pad DP-PD having the second hardness may have a state in which a shape is not deformed by an external pressure. In particular, when the connection pad DP-PD is exposed to the external heat having the second temperature, the connection pad DP-PD may be hardened in a state where the connection pad DP-PD and the driving pad CB-PD are connected directly to each other.

The bonding process between the driving pad CB-PD and the connection pad DP-PD will be described later in greater detail with reference to FIGS. 8A to 8F.

Figure 6:
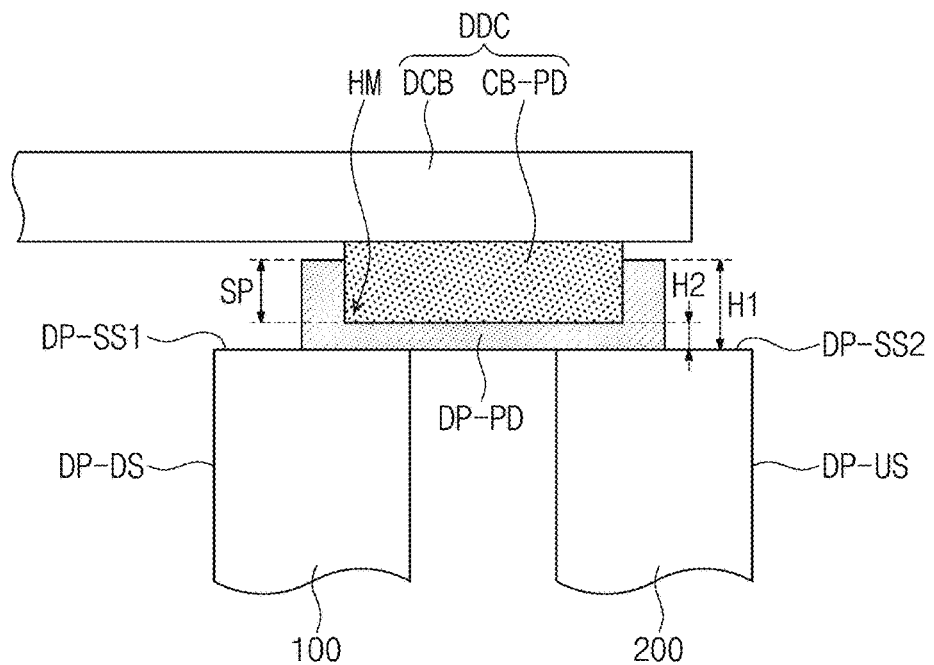
FIG. 6 is a cross-sectional view illustrating a bonding structure between a driving pad of a circuit board and a connection pad of a display panel, according to an embodiment of the invention.
Figure 7:
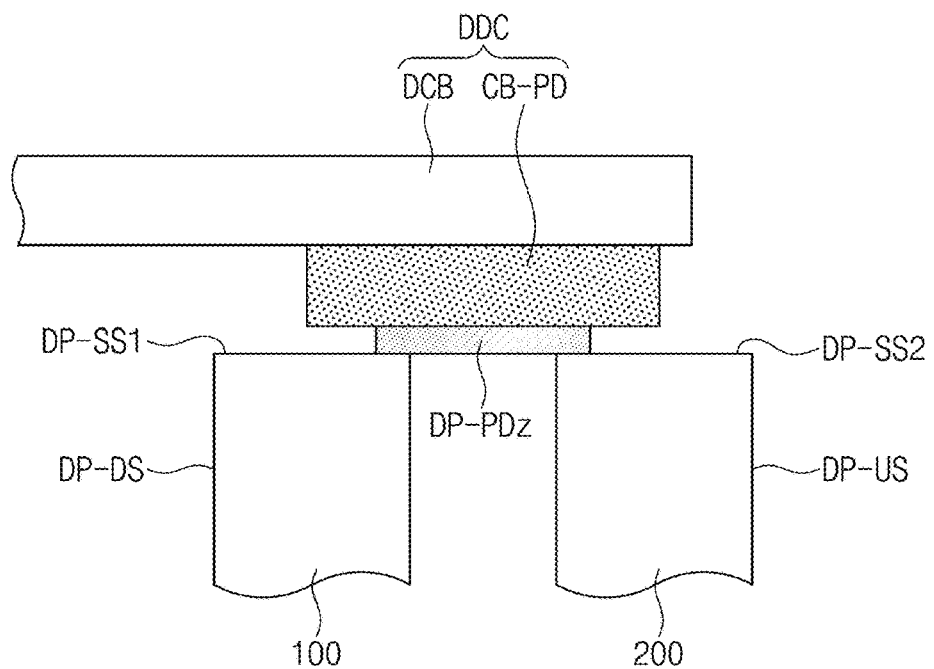
FIG. 7 is a cross-sectional view illustrating a bonding structure between a driving pad of a circuit board and a connection pad of a display panel, according to an alternative embodiment of the invention.

FIG. 6 is a cross-sectional view illustrating a bonding structure between a driving pad of a circuit board and a connection pad of a display panel, according to an embodiment of the invention. FIG. 7 is a cross-sectional view illustrating a bonding structure between a driving pad of a circuit board and a connection pad of a display panel, according to an alternative embodiment of the invention.

Referring to FIG. 6, in an embodiment, the connection pad DP-PD may be disposed on the first side surface DP-SS1 of the first display substrate 100 and the second side surface DP-SS2 of the second display substrate 200. In such an embodiment, the connection pad DP-PD is disposed on both the first and second side surfaces DP-SS1 and DP-SS2 of the first and second display substrates 100 and 200. However, embodiments of the invention are not limited thereto. In an alternative embodiment, the connection pad DP-PD may be disposed on only one of the first side surface DP-SS1 of the first display substrate 100 and the second side surface DP-SS2 of the second display substrate 200.

According to an embodiment of the invention, the connection pad DP-PD may include a top surface, at least a portion of which is recessed to define a recessed space HM, and a bottom surface opposite to the top surface. The top surface of the connection pad DP-PD may face the connection circuit board DDC. The bottom surface of the connection pad DP-PD may face the first side surface DP-SS1 of the first display substrate 100 and the second side surface DP-SS2 of the second display substrate 200.

The driving pad CB-PD may include a first pad portion disposed in the recessed space HM defined in the top surface of the connection pad DP-PD, and a second pad portion which is not in contact with the connection pad DP-PD. A height SP of the recessed space HM may correspond to a thickness of the first pad portion of the driving pad CB-PD. According to an embodiment of the invention, the recessed space HM of the connection pad DP-PD may be formed by pressurization of the driving pad CB-PD. In one embodiment, for example, the driving pad CB-PD may press an upper portion of the connection pad DP-PD having the first hardness at a predetermined pressure or greater, and thus the first pad portion of the driving pad CB-PD may be inserted in the connection pad DP-PD.

In an embodiment, as described above, at least a portion of the top surface of the connection pad DP-PD may be recessed by the driving pad CB-PD. Thus, a thickness H1 of a portion of the connection pad DP-PD not overlapping the driving pad CB-PD may be greater than a thickness H2 of another portion of the connection pad DP-PD overlapping the driving pad CB-PD. In an embodiment, the thickness H1 of the portion may be two or more times greater than the thickness H2 of the other portion.

Referring to FIG. 7, in an alternative embodiment, a connection pad DP-PDz may be disposed on the first side surface DP-SS1 and the second side surface DP-SS2. The entire portion of the connection pad DP-PDz may overlap the driving pad CB-PD, and a planar area (or size) of the connection pad DP-PDz may be less than a planar area (or size) of the driving pad CB-PD when viewed from a plan view in a thickness direction of the connection pad DP-PDz. The driving pad CB-PD may surround the connection pad DP-PDz in a plan view of the connection circuit board DDC.

In a process of bonding the connection pad DP-PDz and the driving pad CB-PD to each other, the connection pad DP-PDz may be hardened based on a first temperature corresponding to the room temperature and thus may have a first hardness. The driving pad CB-PD may press the connection pad DP-PDz having the first hardness by an external pressure. In such an embodiment, the driving pad CB-PD may entirely press the connection pad DP-PDz.

Thereafter, the connection pad DP-PDz may be hardened by external heat having a second temperature higher than the first temperature, and thus the connection pad DP-PDz may have a second hardness higher than the first hardness. In such an embodiment, as described above with reference to FIG. 5B, the connection pad DP-PDz having the first hardness may have a flexible state in which a shape is deformable by an external pressure, and the connection pad DP-PDz having the second hardness may have a state in which a shape is not deformed by an external pressure.

When the connection pad DP-PDz is exposed to environment having the second temperature, the connection pad DP-PDz may be hardened in a state where the connection pad DP-PDz and the driving pad CB-PD are connected directly to each other. In such an embodiment, the connection pad DP-PDz may have the second hardness and may be in contact with the driving pad CB-PD.

FIGS. 8A to 8F are views illustrating a method for manufacturing a display device, according to an embodiment of the invention.

Figure 8A:
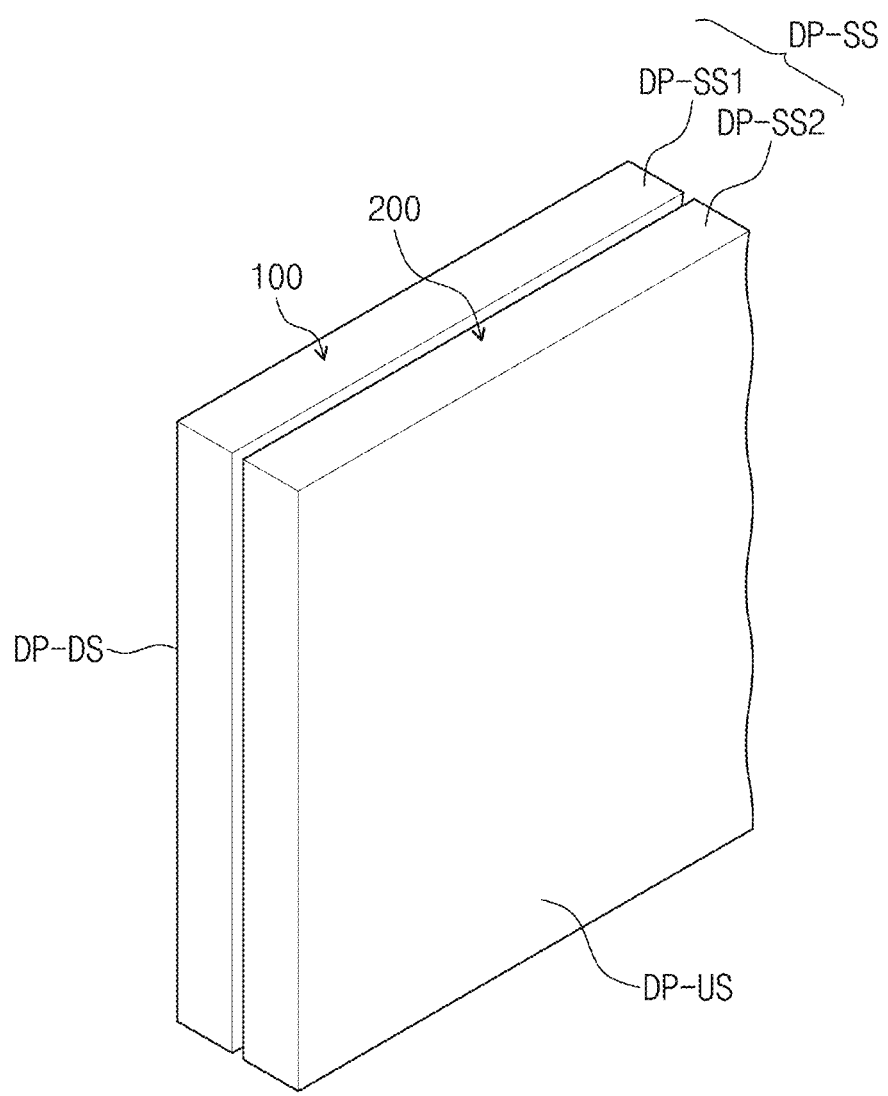
FIGS. 8A to 8F are views illustrating a method for manufacturing a display device, according to an embodiment of the invention.

Referring to FIG. 8A, in an embodiment, a first display substrate 100 and a second display substrate 200 which face each other in the third direction DR3 may be provided. In such an embodiment, as described above with reference to FIG. 2A, the first display substrate 100 and the second display substrate 200 may be coupled to each other by the adhesive layer SLM. In such an embodiment, the second display substrate 200 may be provided as an encapsulation substrate. However, embodiments of the invention are not limited thereto. In an alternative embodiment, the second display substrate 200 may be provided as an encapsulation layer, i.e., a thin film encapsulation layer, and the adhesive layer SLM may be omitted.

Figure 8B:
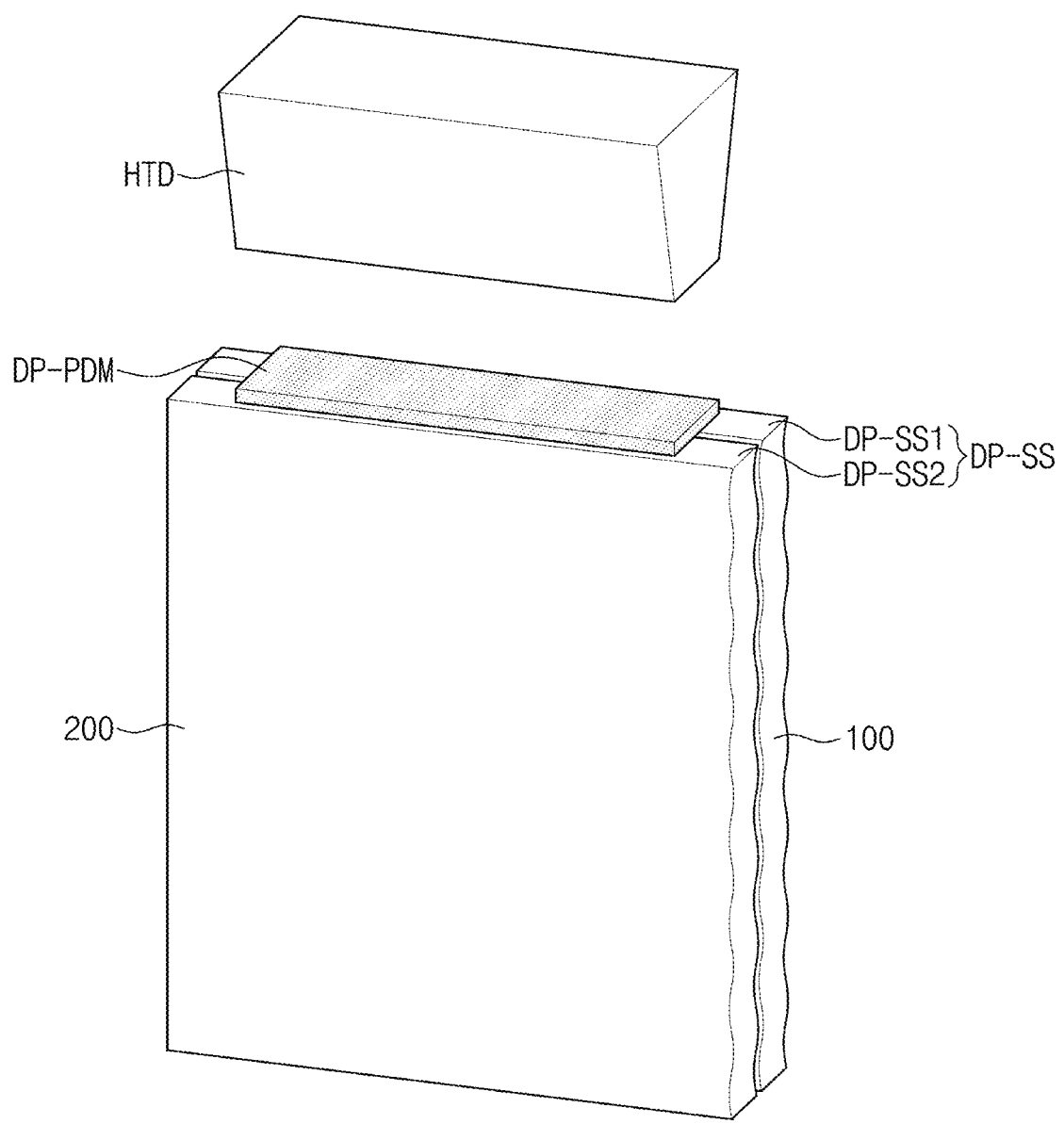

Referring to FIG. 8B, a conductive layer DP-PDM including a conductive material may be provided or formed on a first side surface DP-SS1 of the first display substrate 100 and a second side surface DP-SS2 of the second display substrate 200. In one embodiment, for example, the conductive material may be a metal material such as silver (Ag). The first side surface DP-SS1 of the first display substrate 100 and the second side surface DP-SS2 of the second display substrate 200 may be defined as one side surface DP-SS of a display panel DP. The conductive layer DP-PDM may be provided or formed on the one side surface DP-SS of the display panel DP by one of various methods such as a silk screen method and a metal deposition method.

According to an embodiment of the invention, the conductive layer DP-PDM may be hardened through at least two heating processes. As illustrated in FIG. 8B, in a first process of heating the conductive layer DP-PDM, a heating apparatus HTD may apply external heat having a first temperature to the conductive layer DP-PDM while the conductive layer DP-PDM is formed on the one side surface DP-SS of the display panel DP. The conductive layer DP-PDM may have a first hardness on the basis of the external heat having the first temperature corresponding to a room temperature. According to an embodiment of the invention, a shape of the conductive layer DP-PDM having the first hardness may be deformable by an external pressure.

Figure 8C:
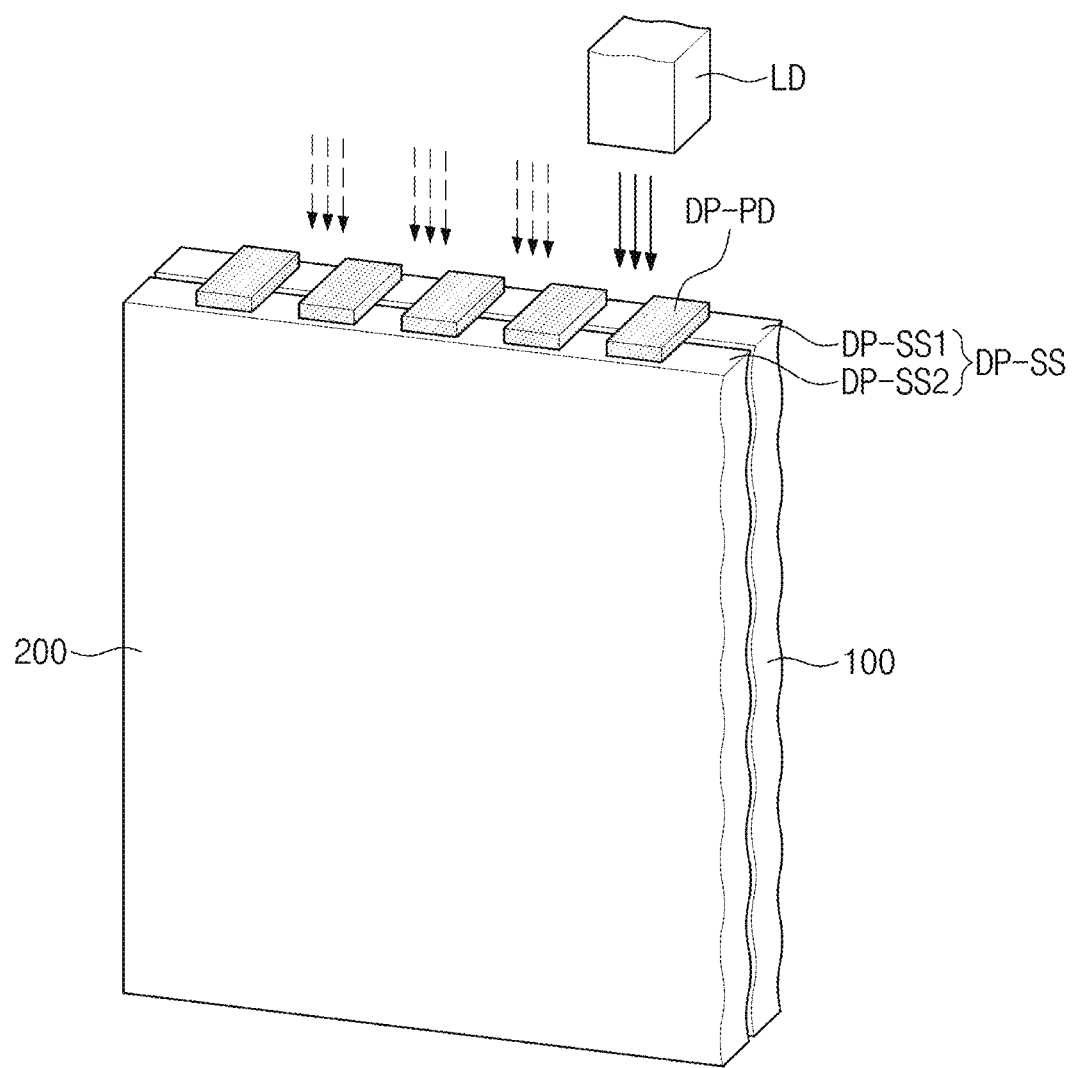

Referring to FIG. 8C, the conductive layer DP-PDM may be divided into a plurality of connection pads DP-PD by a laser module LD. Portions of the conductive layer DP-PDM which correspond to portions between the connection pads DP-PD may be removed by laser radiated from the laser module LD, and thus the connection pads DP-PD may be formed. Accordingly, the connection pads DP-PD may be spaced apart from each other in the first direction DR1.

In an embodiment, even though not shown in FIG. 8C, each of the connection pads DP-PD may be in electrical contact with a corresponding one of the data lines DL illustrated in FIG. 3.

Figure 8D:
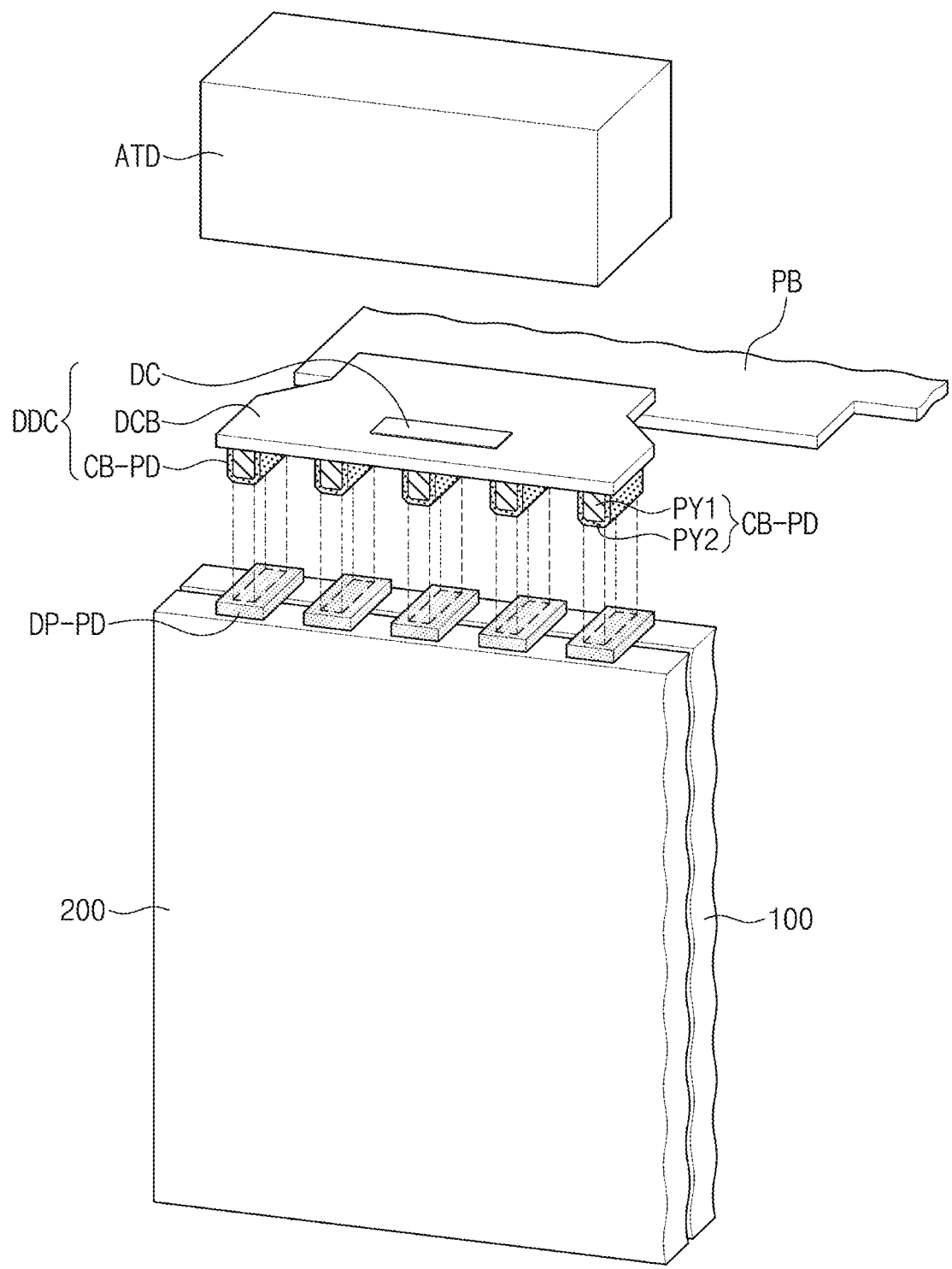

Referring to FIG. 8D, a connection circuit board DDC and a main circuit board PB may be prepared. The connection circuit board DDC and the main circuit board PB may be provided in a state where they are bonded to each other. The connection circuit board DDC may include a driving chip DC disposed on a top surface of a base board DCB, and a plurality of driving pads CB-PD disposed on a bottom surface of the base board DCB.

According to an embodiment of the invention, an aligning process may be performed in a way such that the driving pads CB-PD of the connection circuit board DDC face the connection pads DP-PD of the display panel DP, respectively, and then, the driving pads CB-PD of the connection circuit board DDC may come into contact with the connection pads DP-PD of the display panel DP, respectively.

Thereafter, an upper portion of the connection circuit board DDC may be pressed by a pressing apparatus ATD. The driving pads CB-PD may respectively press portions of the connection pads DP-PD by external force provided through the pressing apparatus ATD. As a result, top surfaces of the connection pads DP-PD may have recessed spaces HM formed by the pressure provided by the driving pads CB-PD, and the driving pads CB-PD may be disposed in the recessed spaces HM. The connection pad DP-PD may surround the driving pad CB-PD corresponding thereto in a plan view of the connection circuit board DDC.

Figure 8E:
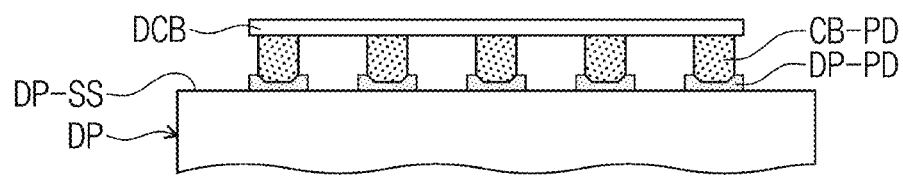

Referring to FIG. 8E, portions of the driving pads CB-PD may be inserted in the connection pads DP-PD, respectively. In such an embodiment, the driving pads CB-PD may be embedded in the recessed spaces HM defined in the connection pads DP-PD, respectively.

According to an embodiment of the invention, the process of pressing the connection circuit board DDC, described with reference to FIG. 8D, may be performed and at the same time, laser may be radiated to the connection pads DP-PD illustrated in FIG. 8E. In such an embodiment, the process of pressing the connection circuit board DDC and the process of radiating laser to the connection pads DP-PD may be performed simultaneously with each other. The laser may increase the temperature of the connection pads DP-PD to be a second temperature higher than the first temperature and may harden the connection pads DP-PD. In one embodiment, for example, the laser may provide high heat having a temperature of 100 degrees Celsius or greater.

In an embodiment, an intensity of the laser (hereinafter, referred to as 'first laser') outputted from the laser module LD described with reference to FIG. 8C may be different from an intensity of the laser (hereinafter, referred to as 'second laser') described with reference to FIG. 8E. In one embodiment, for example, the intensity of the first laser for removing the portions of the conductive layer DP-PDM described with reference to FIG. 8C may be greater than the intensity of the second laser described with reference to FIG. 8E.

The connection pads DP-PD may have a second hardness higher than the first hardness by the second laser. Since the connection pads DP-PD have the second hardness, a contact state of the connection pads DP-PD and the driving pads CB-PD embedded in the connection pads DP-PD may be maintained.

Figure 8F:
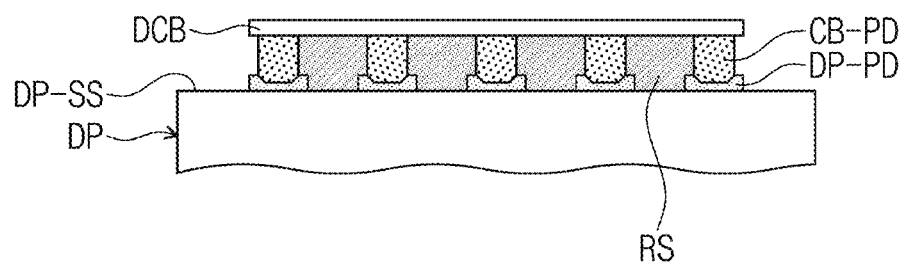

Referring to FIG. 8F, a filler RS may be provided or formed between the base board DCB of the connection circuit board DDC and the one side surface DP-SS of the display panel DP. The filler RS may be an adhesive resin that connects the connection circuit board DDC and the display panel DP to each other. The filler RS may fully cover the driving pads CB-PD disposed on the base board DCB and the connection pads DP-PD disposed on the one side surface DP-SS of the display panel DP.

Since the driving pads CB-PD and the connection pads DP-PD are covered by the filler RS, the driving pads CB-PD and the connection pads DP-PD may be protected from external air. As a result, the driving pads CB-PD and the connection pads DP-PD may be effectively prevented from being oxidized by the external air.

According to embodiments of the invention, the driving pads of the connection circuit board may be connected directly to the connection pads of the display panel, respectively. As a result, an electrical short may be effectively prevented from occurring between adjacent two of the driving pads of the connection circuit board and/or between adjacent two of the connection pads of the display panel.

In embodiments of the invention, the connection pads may be disposed on one side surface of the display panel. As a result, the area (or size) of the non-display area of the display device may be reduced.

While the invention have been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display device comprising:
a display panel comprising a display substrate, and a connection pad disposed on a side surface of the display substrate; and
a circuit board comprising a base board, and a driving pad disposed on the base board to face the connection pad and in electrical contact with the connection pad,
wherein
the connection pad includes a top surface of which at least a portion is recessed to define a recessed space and facing the base board, and a bottom surface facing the side surface of the display substrate, and
the driving pad is disposed in the recessed space.

2. The display device of claim 1, wherein
an entire portion of the driving pad overlaps the connection pad, and
a planar area of the connection pad is greater than a planar area of the driving pad.

3. The display device of claim 1, wherein one portion of the connection pad not overlapping the driving pad has a thickness greater than a thickness of another portion of the connection pad overlapping the driving pad.

4. The display device of claim 3, wherein the thickness of the one portion of the connection pad is two or more times greater than the thickness of the another portion of the connection pad.

5. The display device of claim 1, wherein the driving pad comprises:
a first metal layer disposed on the base board; and
a second metal layer covering the first metal layer and disposed on the base board.

6. The display device of claim 5, wherein
a thickness of the first metal layer is greater than a thickness of the second metal layer, and
the first metal layer and the second metal layer include different materials from each other.

7. The display device of claim 6, wherein
the first metal layer includes copper, and
the second metal layer includes tin.

8. The display device of claim 6, wherein the connection pad includes a material different from materials of the first metal layer and the second metal layer.

9. The display device of claim 1, further comprising:
a filler covering the driving pad and the connection pad, which are in contact with each other,
wherein the filler is disposed between the base board and the side surface of the display panel.

10. The display device of claim 1, wherein the display substrate comprises:
a first display substrate including a first side surface; and
a second display substrate facing the first display substrate and including a second side surface aligned with the first side surface,
wherein the side surface of the display panel is defined by the first side surface and the second side surface.

11. A display device comprising:
a display panel comprising a display substrate, and a connection pad disposed on a side surface of the display substrate; and
a circuit board comprising a base board, and a driving pad disposed on the base board to face the connection pad and in electrical contact with the connection pad,
wherein
an entire portion of the connection pad overlaps the driving pad in a plan view of the circuit board, and
the driving pad surrounds the connection pad in the plan view of the circuit board.

12. The display device of claim 11, wherein the driving pad comprises:
a first metal layer disposed on the base board; and
a second metal layer covering the first metal layer and disposed on the base board,
wherein the connection pad includes a material different from materials of the first metal layer and the second metal layer.

13. A method for manufacturing a display device, the method comprising:
preparing a display substrate;
forming a conductive layer by providing a conductive material onto one side surface of the display substrate;
forming a plurality of connection pads spaced apart from each other by radiating a first laser to the conductive layer;
performing an aligning process in a way such that driving pads of a circuit board face the connection pads, respectively;
disposing the driving pads to contact the connection pads, respectively;
pressing the circuit board in a way such that portions of the connection pads are recessed by the driving pads, respectively; and
radiating a second laser to the connection pads to harden the connection pads.

14. The method of claim 13, further comprising:
applying a heat based on a first temperature to the conductive layer after the forming the conductive layer,
wherein the conductive layer has a first hardness by the first temperature.

15. The method of claim 14, wherein
the second laser provides heat of a second temperature higher than the first temperature to the connection pads, and
wherein the connection pads have a second hardness higher than the first hardness by the second laser.

16. The method of claim 15, wherein an intensity of the first laser is greater than an intensity of the second laser.

17. The method of claim 14, wherein the first temperature is a room temperature.

18. The method of claim 13, wherein
an entire portion of a first driving pad of the driving pads overlaps a first connection pad of the connection pads, which corresponds to the first driving pad, in a plan view of the circuit board, and
the first connection pad surrounds the first driving pad in the plan view of the circuit board.

19. The method of claim 13, wherein the pressing the circuit board and the radiating the second laser to the connection pads are performed simultaneously with each other.

20. The method of claim 13, further comprising:
providing a filler between the one side surface of the display substrate and the circuit board,
wherein the filler fully covers the driving pads and the connection pads.

* * * * *